(12) United States Patent
Muchaidze et al.

(10) Patent No.: US 10,325,057 B2
(45) Date of Patent: Jun. 18, 2019

(54) USING COMPUTER-AIDED DESIGN LAYOUT IN SCANNING SYSTEM

(71) Applicant: Amber Precision Instruments, Inc., San Jose, CA (US)

(72) Inventors: Giorgi Muchaidze, Campbell, CA (US); Besarion Chikhradze, Santa Clara, CA (US); Hamed Kajbaf, Los Angeles, CA (US)

(73) Assignee: AMBER PRECISION INSTRUMENTS, INC., San Jose, CA (US)

( * ) Notice: Subject to any disclaimer, the term of this patent is extended or adjusted under 35 U.S.C. 154(b) by 323 days.

(21) Appl. No.: 15/239,735

(22) Filed: Aug. 17, 2016

(65) Prior Publication Data
US 2017/0068771 A1 Mar. 9, 2017

Related U.S. Application Data

(60) Provisional application No. 62/206,242, filed on Aug. 17, 2015.

(51) Int. Cl.
| | |
|---|---|
| *G06F 17/50* | (2006.01) |
| *G01R 31/3183* | (2006.01) |
| *G01R 31/28* | (2006.01) |
| *G01R 1/073* | (2006.01) |

(52) U.S. Cl.
CPC ....... *G06F 17/5081* (2013.01); *G01R 31/287* (2013.01); *G01R 31/2887* (2013.01); *G01R 31/318364* (2013.01); *G06F 17/5068* (2013.01); *G01R 1/07328* (2013.01)

(58) Field of Classification Search
CPC ......... G06T 2207/30148; G06T 7/0006; G06T 2207/20076; G06T 7/33; G06F 17/5045; G06F 17/5081; G06F 15/00; G06F 3/048; G06F 3/0304; G03F 1/84; G01B 21/04; G01B 11/005; G01B 5/008; G01B 11/03; G01B 11/25; G01B 21/045; G01B 21/047; G01B 21/16; G01B 7/008; G01B 5/20; G01B 11/002; G01B 11/24; G01B 11/2441
USPC ........... 716/51, 112, 136–137; 702/121, 134, 702/168, 171–172, 189
See application file for complete search history.

(56) References Cited

U.S. PATENT DOCUMENTS

| | | | |
|---|---|---|---|
| 9,618,554 B2* | 4/2017 | Kajbaf | ............... G01R 29/0892 |
| 9,985,733 B1* | 5/2018 | Lee | ......................... H04B 17/29 |
| 2005/0184236 A1* | 8/2005 | Baur | ........................ G01N 1/28 |
| | | | 250/311 |
| 2009/0028423 A1* | 1/2009 | Sandstrom | ........... G01N 21/956 |
| | | | 382/149 |

* cited by examiner

*Primary Examiner* — Nghia M Doan
(74) *Attorney, Agent, or Firm* — Loza & Loza, LLP; Thomas H. Ham

(57) ABSTRACT

A system and method for testing a device under test (DUT) combines measurement data of field components values made at different sampling locations away from the DUT with computer-aided design layout of the DUT. The combined computer-aided design layout of the DUT and the measurement data can then be displayed for analysis.

18 Claims, 11 Drawing Sheets

USING COMPUTER-AIDED DESIGN LAYOUT IN SCANNING SYSTEM

CROSS REFERENCE TO RELATED APPLICATION

This application is entitled to the benefit of U.S. Provisional Patent Application Ser. No. 62/206,242, filed on Aug. 17, 2015, which is incorporated herein by reference.

BACKGROUND OF THE INVENTION

When testing a device under test (DUT), such as a printed circuit board (PCB) or other electronic device, the DUT may be subjected to test signals, such as electrical and/or magnetic signals, at various testing points about the DUT by, for example, scanning a probe or other testing instrument about the DUT. Various measurements can be made for each testing point and each test signal, such as electromagnetic field emission measurements, and injecting electromagnetic field into DUT elements by field coupling or direct injection methods.

The most common way to visualize the measured (scanned) data is overlapping the measured data to a DUT picture to analyze any detected issues. However, this approach requires the user to have an in-depth knowledge regarding the DUT. For example, the user would have to know or look up various components of the DUT about particular testing points of interest even if these components are visible on the DUT image. In addition, some of the components of the DUT may not be visible, i.e., may be obscured by other parts of the DUT, on the DUT image, which makes knowledge regarding all the components of the DUT critical for analysis.

SUMMARY OF THE INVENTION

A system and method for testing a device under test (DUT) combines measurement data of field components values made at different sampling locations away from the DUT with computer-aided design layout of the DUT. The combined computer-aided design layout of the DUT and the measurement data can then be displayed for analysis.

A system for testing a device under test (DUT) in accordance with an embodiment of the invention comprises a probe scanning system, an electrical analyzing instrument and a processing system. The probe scanning system is configured to move a measurement probe to different sampling locations away from the DUT. The electrical analyzing instrument, which is connected to the measurement probe, is configured to measure field component values at the different sampling locations using the measurement probe. The processing system is configured to control the probe scanning system to move the measurement probe to the different sampling locations away from the DUT, receive the field component values to derive measurement data, combine the measurement data with a computer-aided design layout of the DUT, and display the computer-aided design layout of the DUT with the measurement data for analysis.

A method for testing a device under test (DUT) in accordance with an embodiment of the invention comprises moving a measurement probe to different sampling locations away from the DUT, measuring field component values at the different sampling locations using the measurement probe to derive measurement data, combining the measurement data with a computer-aided design layout of the DUT, and displaying the computer-aided design layout of the DUT with the measurement data for analysis.

Other aspects and advantages of the present invention will become apparent from the following detailed description, taken in conjunction with the accompanying drawings, illustrated by way of example of the principles of the invention.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
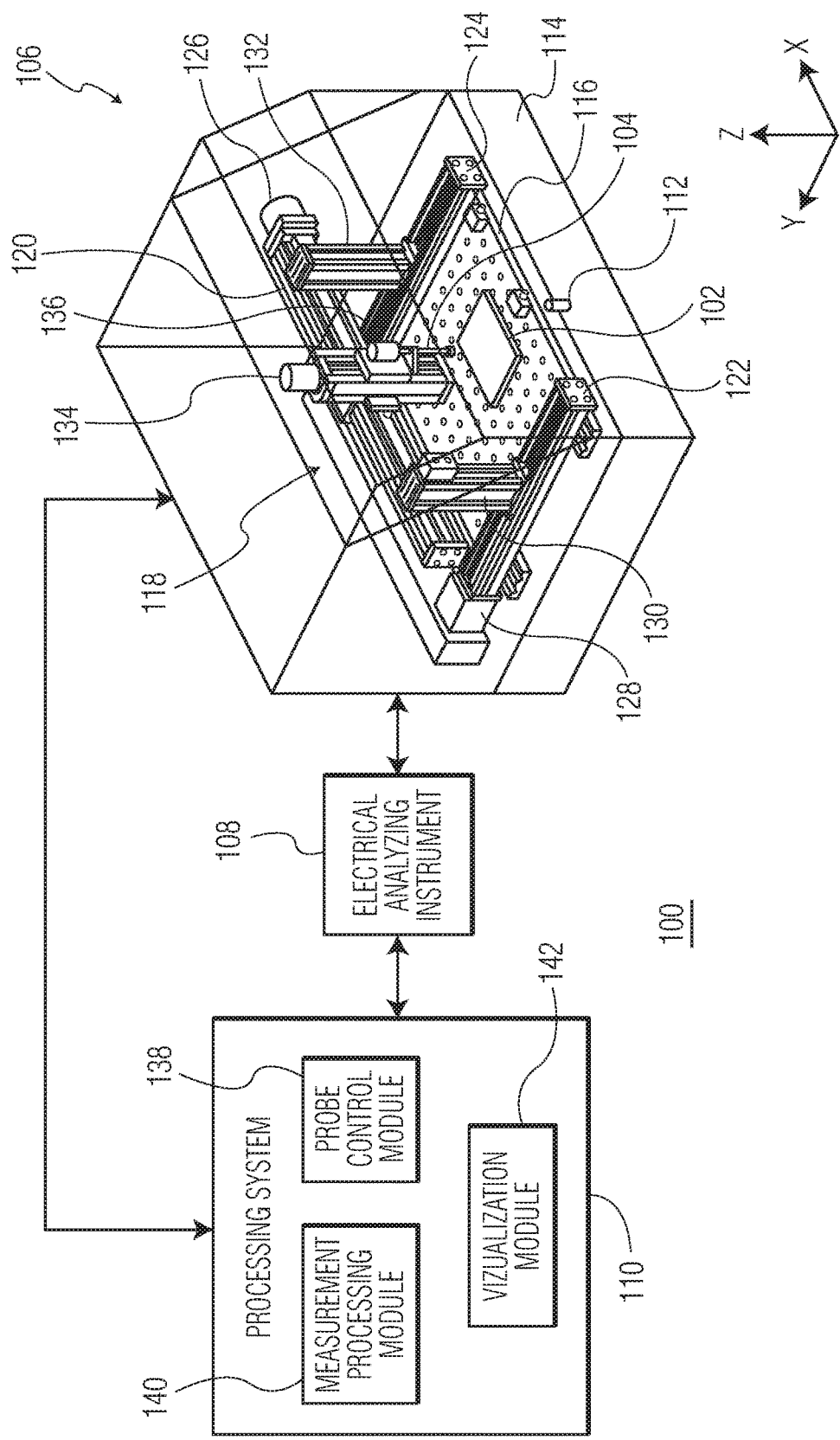
FIG. 1 is a diagram of a system in accordance with an embodiment of the invention.

With reference to FIG. 1, a testing system 100 for testing a device under test (DUT) 102 for various processing, such as data analysis, numerical simulations and analyses by EXPERT systems, in accordance with an embodiment of the invention is described. The DUT can be any electronic device, module or system, such as an integrated circuit (IC) or a printed circuit board (PCB). The testing system 100 is designed to take measurements at various points about the DUT and visually present the measurements using a computer-aided design layout of the DUT, which includes various information besides visual information, so that the DUT can be analyzed efficiently and effectively, as explained below.

As shown in FIG. 1, the testing system 100 includes a probe scanning system 106, an electrical analyzing instrument 108 and a processing system 110. The probe scanning system is designed to move a measurement probe 104 so that the DUT 102, which is placed on the probe scanning system, can be scanned by the measurement probe. The electrical analyzing instrument is electrically connected to the measurement probe to receive signals from the measurement probe. The electrical analyzing instrument is also connected to a reference probe 112 to receive signals from the reference probe or to transmit signals to the reference probe, depending on the mode of operation of the testing system. The measurement and reference probes may be configured to sense electric or magnetic field. If used to receive signals, the reference probe is positioned at a fixed location close to the DUT to receive signals from the DUT, which is in operation to emit radiations. However, if used to transmit signals, the reference probe is positioned at a fixed location in contact with the DUT to transmit signals into the DUT, which can be turned off. Using the signals received from one or both of the measurement and reference probes, the electrical analyzing instrument 108 can measure electrical or magnetic field component from the DUT at various sampling locations. The processing system may process the measured field components at the sampling locations to compute field components at corresponding locations on the surface of the DUT.

The probe scanning system 106 is configured to position the measurement probe 104 to different sampling locations predefined distances from the DUT 102 so that the measurement probe can sample electric or magnetic field at the sampling locations. In an embodiment, as shown in FIG. 1, the probe scanning system includes a base 114, a scanning plate 116, a scan head 118, linear tracks 120, 122 and 124, motors 126 and 128 and connecting structures 130 and 132. The base 114 provides structural support for other components of the probe scanning system. The scanning plate 116 is attached to the base 114. The scanning plate 116 provides a surface on which the DUT 102 is placed for testing. The scan head 118 is configured to hold the measurement probe 104 and to raise and lower the measurement probe along the Z-axis, as indicated in FIG. 1, so that the measurement probe can be positioned above the DUT at desired sampling locations. The scan head 118 may also configured to rotate the measurement probe about the Z-axis. The scan head 118 includes a motor 134 to vertically displace the measurement probe along the Z-axis and a motor 140 to rotate the probe about the Z-axis. The scan head 118 is operably connected to the linear track 120, which is aligned with the X-axis, as indicated in FIG. 1. The motor 126 is attached to the track 120 to linearly displace the scan head along the X-axis. Thus, the motor 126 controls the linear displacement of the measurement probe, which is attached to the scan head, along the X-axis. The track 120 is attached to the connecting structures 130 and 132, which are operably connected to the linear tracks 122 and 124. The linear tracks 122 and 124 are attached to the base 114 and are aligned with the Y-axis, as indicated in FIG. 1. The motor 128 is attached to the track 122 to linearly displace the connecting structures 130 and 132, the track 120 and the scan head 119 along the Y-axis. Thus, the motor 128 controls the linear displacement of the measurement probe, which is attached to the scan head 118, along the Y-axis. Consequently, the probe scanning system 106 is enabled to move the measurement probe along the X-axis, the Y-axis and the Z-axis, and to rotate the measurement probe about the Z-axis.

Figure 2:
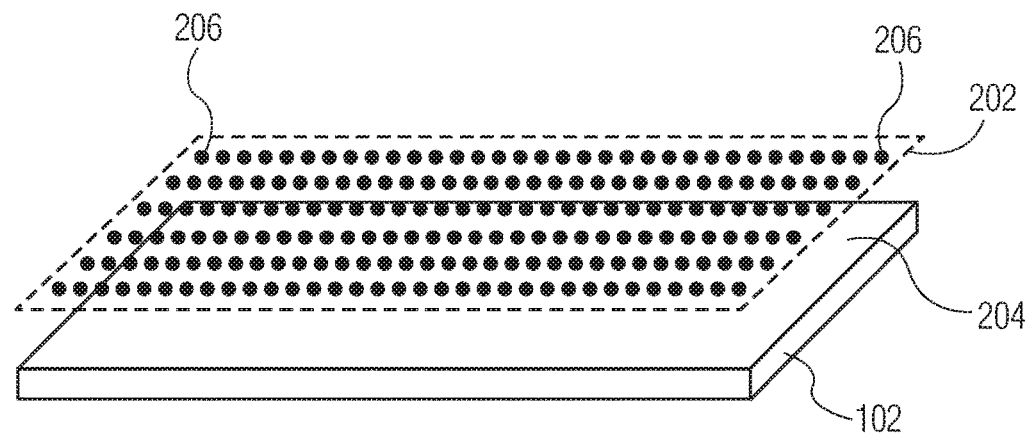
FIG. 2 illustrates a scanning plane and a source plane in accordance with an embodiment of the invention.

In operation in accordance with some embodiments of the invention, as illustrated in FIG. 2, the probe scanning system 106 displaces the measurement probe 104 on a measurement or scanning plane 202, which is substantially parallel to a reference or source plane 204, i.e., the upper surface of the DUT 102, at a predefined distance. As used herein, the term "substantially parallel to the surface" means within +/−5% of being parallel to the surface. The distance between the scanning plane and the surface of the DUT can be any distance at which electric or magnetic fields can be detected by the measurement probe 104 at the scanning plane. In some modes of operation, the probe scanning system 106 displaces the measurement probe so that electric or magnetic field measurements can be made uniformly on the scanning plane. As illustrated in FIG. 2, electric or magnetic field measurements can be made at various sampling locations 206 on the scanning plane that are equidistant from each other, which form a grid of sampling locations on the scanning plane. The separation distance of the sampling locations may be less than $\lambda/2$, where $\lambda$ is the wavelength of the signal of interest, so that the Nyquist spatial sampling criterion is satisfied. The operation of the probe scanning system is controlled by the processing system 110, which provides various control signals to move the measurement probe.

Figure 3:
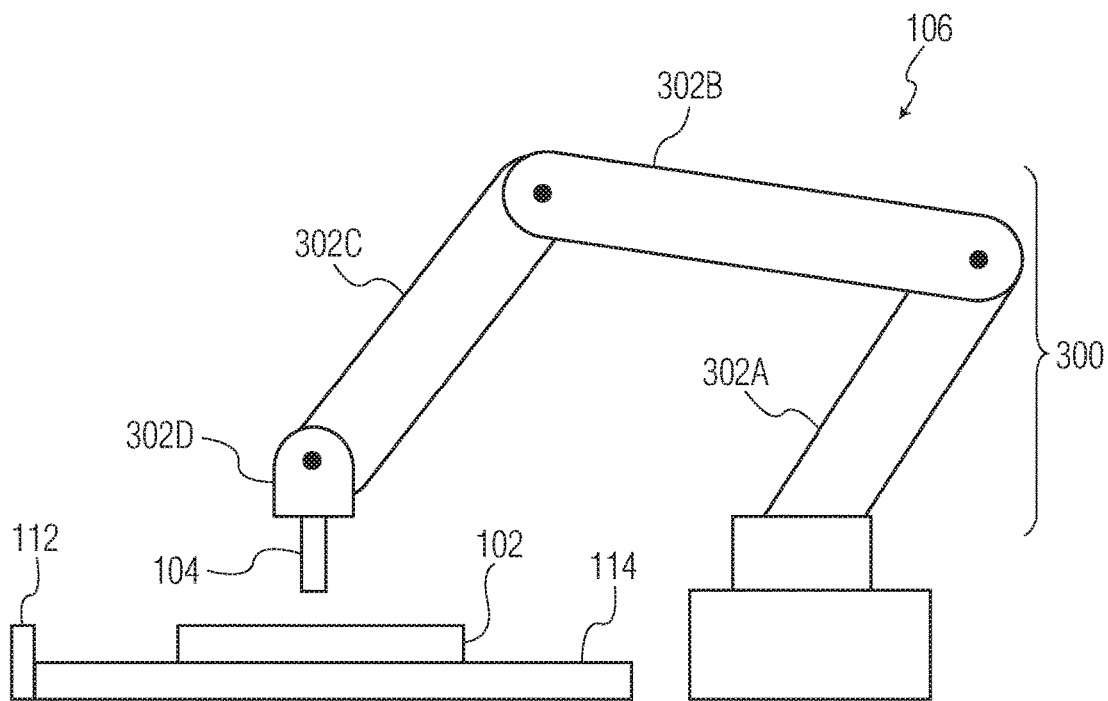
FIG. 3 is a diagram of a probe scanning system in accordance with another embodiment of the invention.

In an alternative embodiment, as illustrated in FIG. 3, the probe scanning system 106 includes a robotic arm 300 to displace and rotate the measurement probe 104 as needed. As an example, the robotic arm may have six degrees of freedom. In the illustrated embodiment, the robotic arm 300 includes sections 302A, 302B, 302C and 302D, which are connected by joints that allow rotational motion and/or translational displacement. Thus, the robotic arm 300 can move the measurement probe to the different sampling locations around the DUT 102.

The probe scanning system 106 of the testing system 100 is not limited to the embodiments shown in FIGS. 1 and 3. The probe scanning system may use any type of a mechanical device that is able to move the measurement probe 104 to different sampling locations about the DUT 102. Furthermore, the probe scanning system may use other means than motors to move the measurement probe, e.g., an air pressure driven system.

The electrical analyzing instrument 108 is used to measure the phase and magnitude of the electric or magnetic field components at the different sampling locations about the DUT 102 using the scanned measurement probe 104 and the reference probe 112, which are connected to the electrical analyzing instrument. As noted above, the reference probe is fixed at a location, which may be at some distance from the DUT with high signal-to-noise ratio (SNR) or in physical contact with the DUT when used to receive a reference signal from the DUT or which may be in physical contact with the DUT when used to transmit a reference signal into the DUT. The electrical analyzing instrument operates to compute complex electric or magnetic component values (phase resolved) for the measured electric or magnetic field components at the sampling locations. The electrical analyzing instrument may be a radio frequency (RF) phase resolved frequency domain instrument, such as a vector network analyzer (VNA) in s-parameter mode or tuned receiver mode, or a time domain instrument, such as an oscilloscope.

The processing system 110 of the testing system 100 is configured or programmed to control the probe scanning system 106 and to process the measurement data acquired by the electrical analyzing instrument 108 at the different sampling locations about the DUT 102. In addition, the processing system is configured or programmed to allow a user to analyze the measured data using one or more computer-aided design layouts, which allows for further advanced analyses of the DUT. The processing system includes a probe control module 138, a measurement processing module 140, and a visualization module 142. These modules may be implemented in any combination of software and hardware. In a particular embodiment, these modules are implemented as algorithms or one or more software programs executed by one or more processors of the processing system. In some embodiments, the processing system is a computer system, such as a personal computer (PC), with memory, one or more processors and other components commonly found in a PC. However, in other embodiments, the processing system may be a special-purpose computer.

The probe control module 138 is configured to control the probe scanning system 106 so that the measurement probe 104 is displaced to the different sampling locations about the DUT 102. In an embodiment, the probe control module controls the probe scanning system so that the measurement probe is displaced to the different sampling locations that are uniformly distributed in a grid system, as illustrated in FIG. 2. Thus, in this embodiment, electric or magnetic field component measurements are made at the uniformly distributed sampling locations, which may be on a scanning plane parallel to the DUT.

The measurement processing module 140 is configured to process the electric or magnetic field component measurements made at the sampling locations. The measurement processing module maps the different measurements at the sampling locations relative to the DUT 102 so that the measurements can be used for visualizations and various analyses, as explained below. In some embodiments, the measurement processing module may be configured to process the electric or magnetic field component measurements made at the sampling locations to derive the electric or magnetic field component values at corresponding locations on the DUT using a 2D emission source microscopy (ESM) algorithm, as explained in U.S. Patent Publication No. US 2015/0177301 A1, titled "Emission Source Microscopy for Electromagnetic Interference Applications," which is incorporated herein by reference.

The visualization module 142 is configured to visually present the measurements made at the sampling locations relative to the DUT 102. The visualization module combines a computer-aided design layout of the DUT with the measurements so that the combined data can be used for visual presentation and further processing.

Figure 4A:
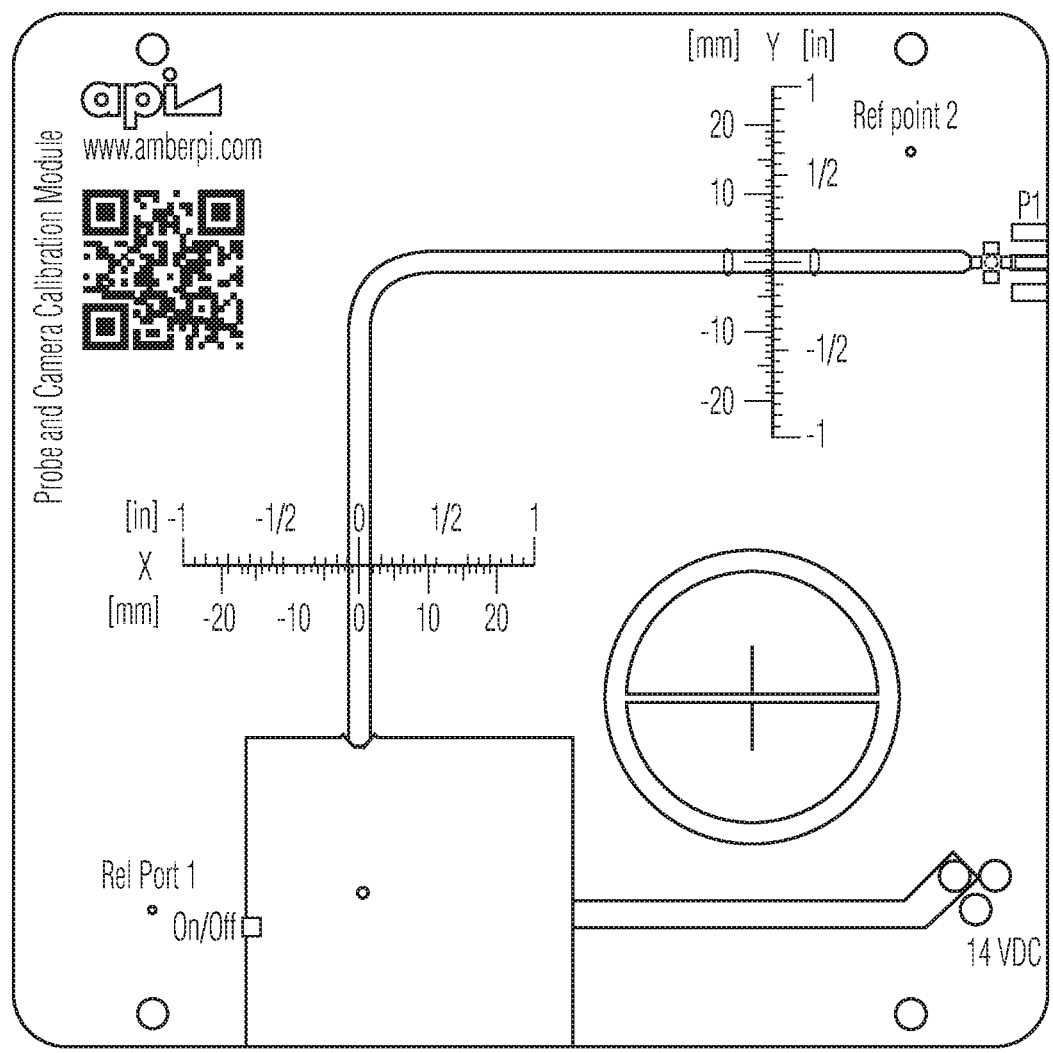
FIGS. 4A-4D illustrate a computer-aided design layout of a printed circuit board (PCB) in accordance with an embodiment of the invention.
Figure 4B:
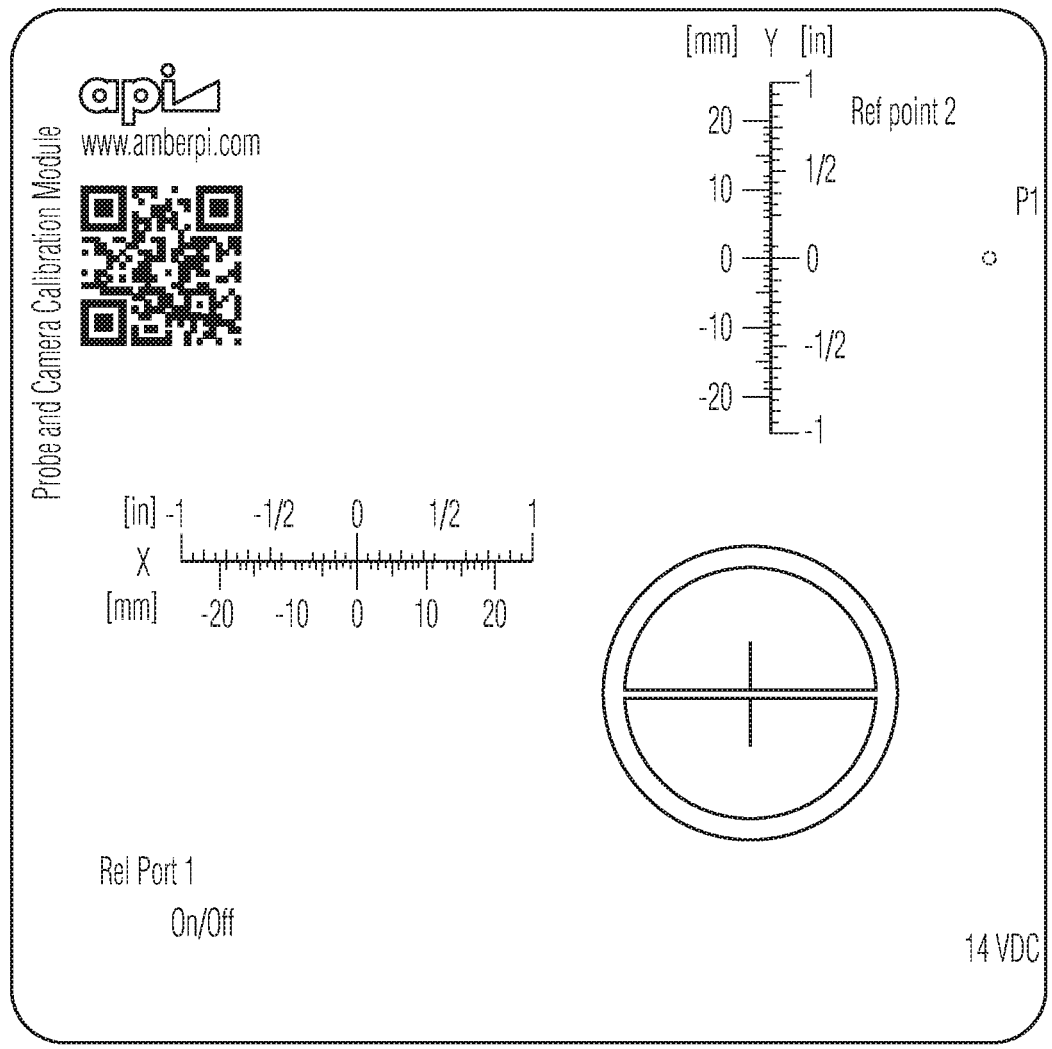
Figure 4C:
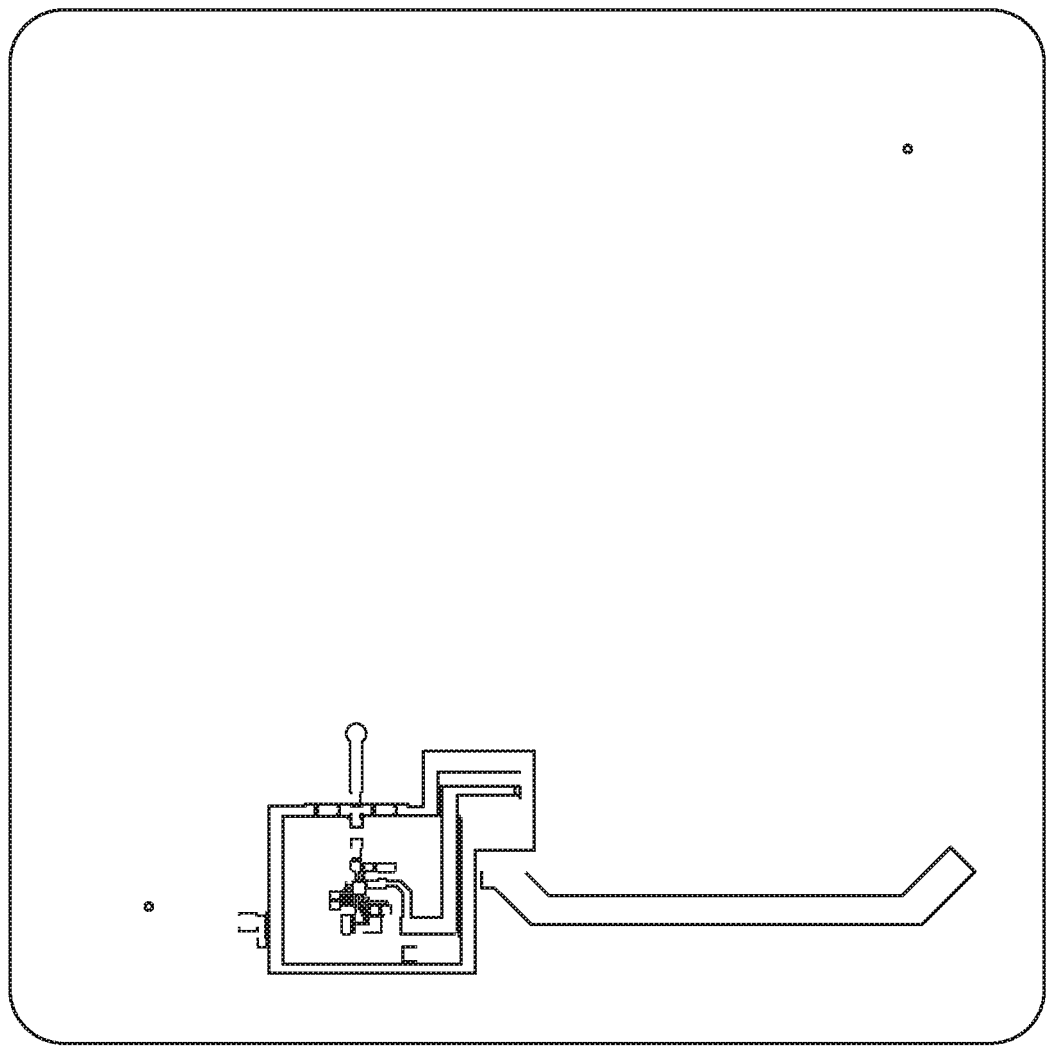
Figure 4D:
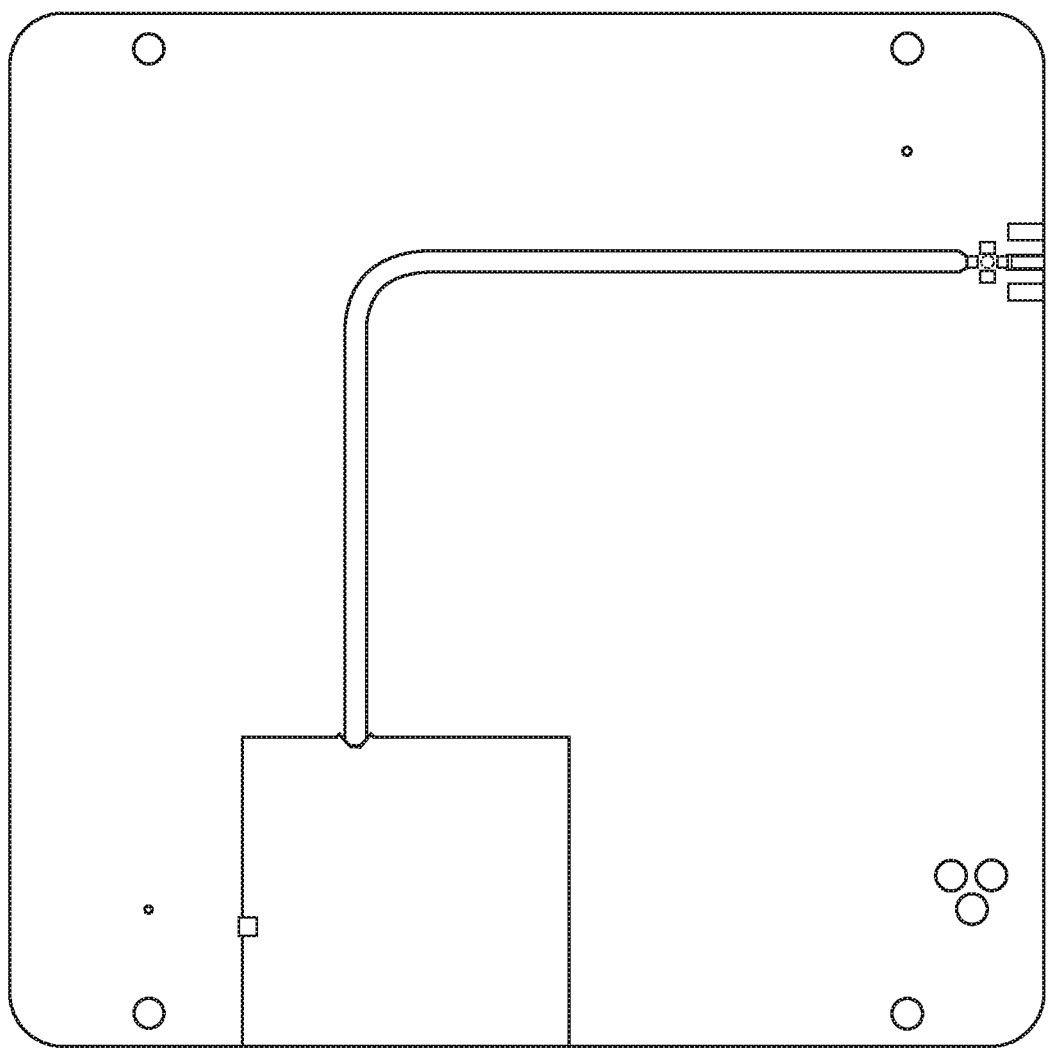

The computer-aided design layout of the DUT 102, which may be provided by the manufacturer of the DUT, includes a visual representation of the DUT. The visual representation of the DUT may be a three-dimensional representation of the DUT, which allows a user to see different layers of the DUT from the front or top side of the DUT, e.g., the surface of the DUT facing up from the scanning plate 116 on which the DUT is positioned during testing, to the bottom side of the DUT, e.g., the surface of the DUT facing down to the scanning plate 116. An example of a computer-aided design layout of a DUT, in this case a PCB, is shown in FIGS. 4A-4D. FIG. 4A illustrates the computer-aided design layout of the PCB showing all the layers of the PCB. Thus, all the components of the PCB can be seen in FIG. 4A, such as conductive traces, electronic components, and electrical contacts. FIG. 4B illustrates the computer-aided design layout of the PCB showing the overlay layer of the PCB, which only shows labels. FIG. 4C illustrates the computer-aided design layout of the PCB showing the bottom layer of the PCB. FIG. 4D illustrates the computer-aided design layout of the PCB showing the top layer of the PCB. The computer-aided design layout of the PCB may allow other views or slices of the DUT. In addition to visual information, which includes hidden or obscured components of the DUT, the computer-aided design layout of the DUT also includes various other information regarding the DUT or its components, such as conductor layer artwork, drill data, material stack up, netlist (electrical connections description), testing points, component bill of materials, component placement, fabrication data and dimension data. Thus, the combination of the computer-aided design layout data of the DUT with the measurement data of the DUT can be a powerful tool for visualization and analyses, as explained below.

One approach to visualize the measurements made at the various sampling locations about the DUT 102 is to map the measurements to an actual image of the DUT, such as a digital image of the DUT captured using a camera. Such approach would allow a user to look at the measurements, which could indicate strength of the measurements using, for example, different colors, with respect to the image of the DUT so that the user can look at components near an area of interest, as indicated by the strength of the measurements. However, the user may not have full knowledge regarding the particular visible component(s) shown in the image of the DUT that are near the area of interest. Thus, the user may have to acquire such knowledge by looking at some external source, such as the specification for the DUT. Even if the user has knowledge regarding the visible component(s) shown in the image of the DUT near the area of interest, there may be other hidden or obscured component(s) near the area of interest, which may be relevant to the issue at hand. Again, in this situation, the user would have to either have in-depth knowledge regarding these hidden or obscured component(s) or acquire such knowledge by looking at some external source, such as the specification for the DUT. In addition, since the actual image of the DUT has no other information about the DUT than visible information, only information that can be derived from the actual image of the DUT is visible information, which limits the usefulness of the actual image of the DUT with the measurements.

In contrast, combining a computer-aided design layout of the DUT with the measurements provides much more information and allows for the resulting data to be used for post-processing, such as data analyses, numerical simulation and analyses using EXPERT systems. First of all, the combination of a computer-aided design layout of the DUT with the measurements (sometimes referred to herein as "CAD DUT layout with measurements") can provide the same visual information as the combination of an actual image of the DUT with the measurements. However, since computer-aided design layout of the DUT can show internal structures of the DUT as well as the back of the DUT as layers, more "visual" information can be provided by the CAD DUT layout with measurements. Thus, any component of the DUT can be readily identified using the CAD DUT layout with measurements. In addition, information regarding a particular component of the DUT can be readily available for the user since the computer-aided design layout of the DUT can contain information regarding all the components of the DUT, regardless of whether or not the component is visible from the outside of the DUT. This component information may include component identification, dimensions of the component, operating parameters of the component and any other useful information regarding the component.

Figure 5A:
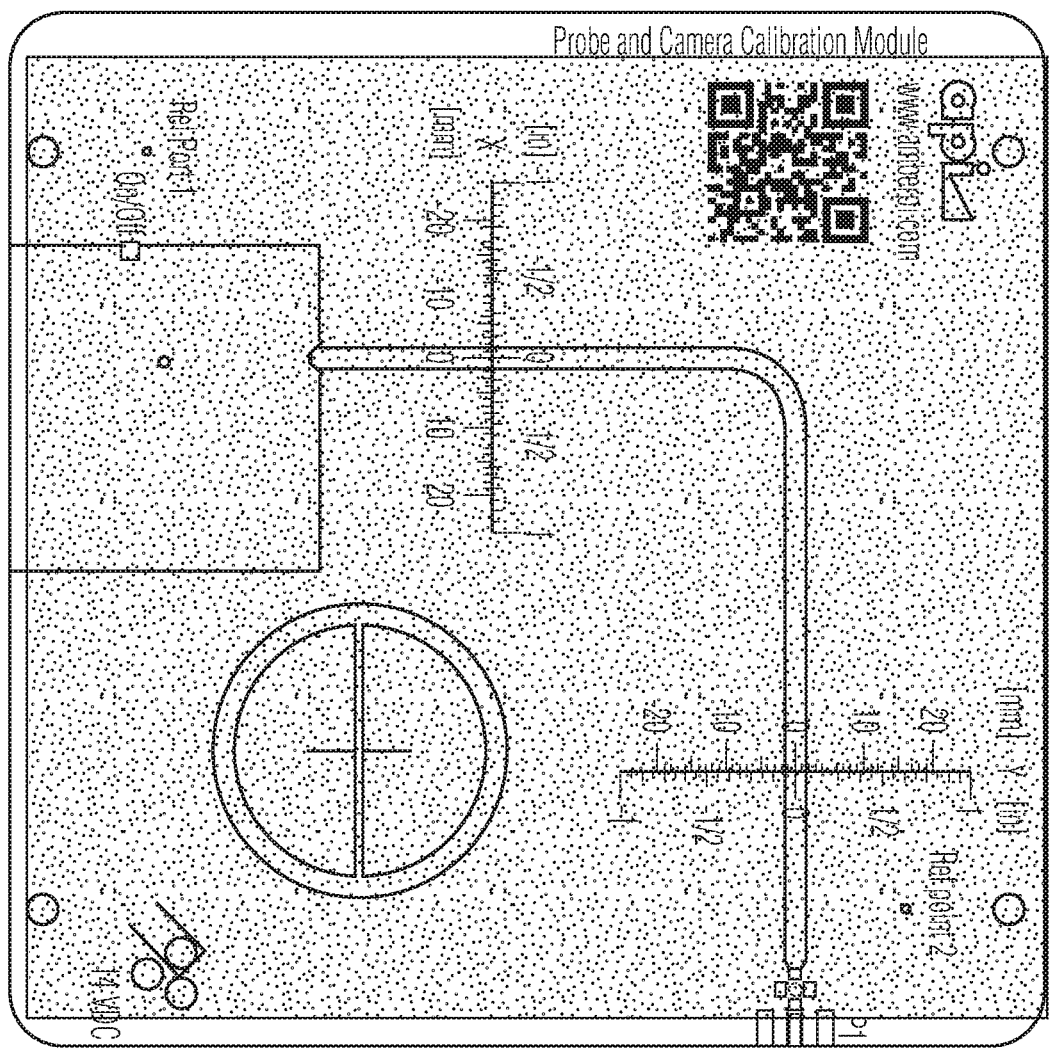
FIGS. 5A-5C illustrate the combined computer-aided design layout of a PCB and measurement data in accordance with an embodiment of the invention.
Figure 5B:
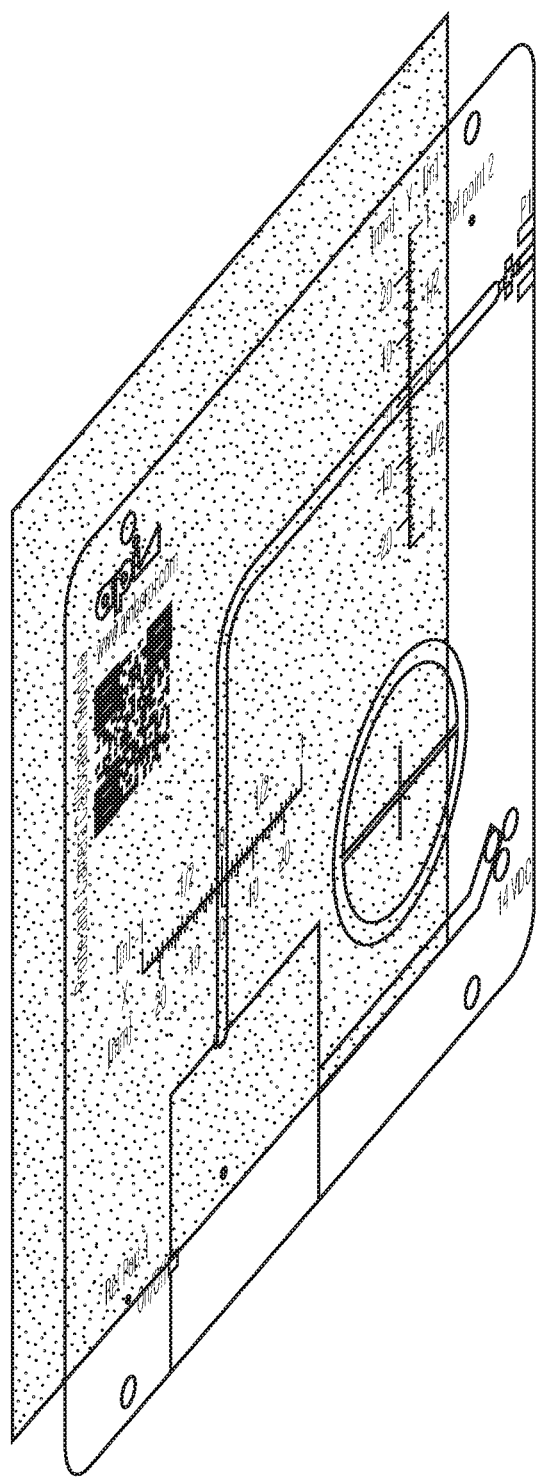
Figure 5C:
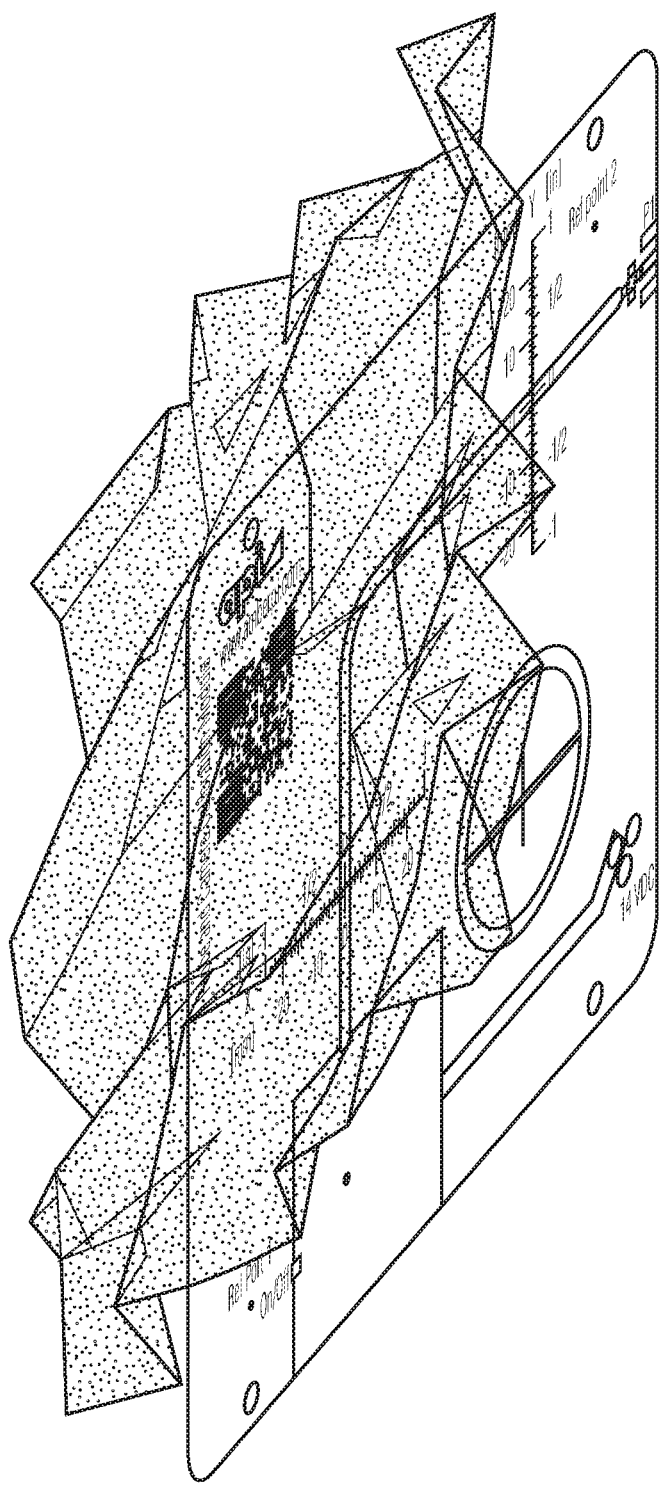

In operation, the visualization module 142 combines the measurement data made at the various sampling locations about the DUT and the computer-aided design layout of the DUT. This combining process involves correlating the CAD DUT layout's location in software space with the DUT in the real space using a reference point that is common to both. The reference point of the DUT is acquired and then used to correlate corresponding reference point of the CAD DUT layout. The measurement data is then added to the CAD DUT layout at the right locations in the CAD DUT layout space that correspond to the actual sampling locations in real space. In some embodiments, the combining process may also involve linking the data or measurement points above the DUT to the underlying structure, i.e., components of the DUT. In one implementation, the property of each measurement point is assigned the name of the underlying DUT structure or component. In another implementation, the property of each under lying DUT structure or component is assigned the identifications (IDs) of all measurement points above it. This linking maybe useful in an analysis using an EXPERT system to file the measurement data by the elements of the DUT. The resulting CAD DUT layout with measurements can be presented on a display device (not shown), such as a computer monitor, so that the CAD DUT layout and the measurements made about the DUT are both in a single view. An example of a resulting CAD DUT layout with measurements is illustrated in FIGS. 5A-5C. In this example, the DUT is a PCB, which corresponds to the CAD layout shown in FIGS. 4A-4D. Thus, in this example, the resulting combination is a CAD PCB layout with measurements. FIG. 5A is a top view of the CAD PCB layout with measurements where the measurements are situated above the CAD PCB layout. FIG. 5B is a perspective view of the CAD PCB layout with measurements, which better illustrates the relative position of the measurements above the CAD PCB layout. FIG. 5C is another perspective view of the CAD PCB layout with measurements in which the measurements have contours, which may indicate radio frequency (RF) emission levels, electrostatic discharge (ESD) susceptibility levels, ESD current density, antenna parameters etc., depending on the scanning technology used.

The process of combining the measurement data made at the various sampling locations about the DUT with the computer-aided design layout of the DUT automatically positions the measurements in the corresponding locations about the CAD DUT layout. Thus, each measurement at a particular sampling location with respect to the actual DUT is positioned at the same location with respect to the CAD DUT layout. With the CAD DUT layout with measurements, a user can visually determine which component or components on the DUT are responsible for the measurements that are of interest. In addition, the user is able to control transparency, view mode (points or surface) and many other options.

The CAD DUT layout with measurements can not only be used for visual analysis, but also for further processing. In an embodiment, the CAD DUT layout with measurements is united or processed to produce one computational model, which contains computational data referenced to the CAD DUT layout. That is, the CAD DUT layout with measurements contain real measurement data at the sampling locations, while a computational model contains computational data or data that has been computed. The computational model may then be used for numerical simulations. For example, computational data can be compared to the measurement data for analysis, or the measurement data can be used as computational data for improved numerical simulations. The computational model can also be used as input to EXPERT systems for further analysis. For example, an EXPERT system can check the measurement data combined with the DUT CAD layout for compliance with certain rules and find locations where the rules are violated.

In some embodiments, the probe control module 138 also uses the CAD DUT layout to control the probe scanning system 106 so that the measurement probe 104 is displaced to the different sampling locations about the DUT 102. In particular, the CAD DUT layout is used to determine the sampling locations about the DUT so that measurements can be made at the sampling locations. One of the most important part of a testing process is precisely defining the sampling locations or scanning points. The sampling locations are positions in the space around the DUT where the probe is placed for data acquisition. The use of the CAD DUT layout with respect to the probe control module allows a user to manually define scan areas above visualized DUT components and traces shown in the CAD DUT layout.

In operation, a user can load CAD DUT layout data from CAD DUT files, such as ODB++ and others, using a user interface associated with the probe control module 138. In a scan area definition tool of the user interface, the user can visualize the CAD DUT layout. Using this tool, the user can also show and hide the CAD DUT layout's layers, zoom, and use cut planes, allowing the user to view the components of the DUT in great detail. The user can then correlate the CAD DUT layout in software space model to the real world position with respect to the DUT. This can be achieved by instructing the probe control module 138 to move the probe to a particular point on the DUT placed on the scanning plate 116. The probe control module 138 then acquires coordinates from the scanning system and correlates to software model coordinates. If the DUT is placed on the scanning plate in a known orientation, only one position in the real space is needed to correlate the CAD DUT layout in software space to the real world space. Thus, the processing system 110 will "know" the position of the DUT on the scanning plate as well as the position of various components of the DUT on the scanning plate. As soon as the CAD DUT layout is visualized and its position is correlated to the position of the DUT on the scanning plate, the user can define scan areas manually above visualized PCB components and traces in the CAD DUT layout. These scan areas can then be used by the probe control module 138 to determine sampling locations for testing.

In an alternative embodiment, the testing points or sampling locations are automatically generated by the probe control module 138 using nets information from the CAD DUT layout. In this embodiment, once the CAD DUT layout is visualized and its position is correlated, the user can select any component or components of the DUT, such as traces and/or electrical components, using the visualized CAD DUT layout, the probe control module automatically generates testing points along the selected component(s). As an example, if a trace on the DUT is selected, the probe control module may generate testing points in a scan area on a plane parallel to the top surface of the DUT at a predefined distance from the DUT, where the scanning area is identical to the area of the trace or slightly enlarged version of the actual area of the trace, as viewed from above the DUT. Thus, if the trace has an area in the shape of an "L", the scan area will also be in the shape of an "L," as viewed from above the DUT. In contrast to a manual scan area definition, which typically will result in a scan area that is larger than necessary, the scan area will be automatically defined by the probe control module that is more optimal in size and resolution, which will reduce the scanning time of the DUT. After the scan area has been defined, the probe control module can control the probe scanning system so that the measurement probe 104 is displaced to the different testing points in the scan area to acquire measurements at the different testing points.

Figure 6:
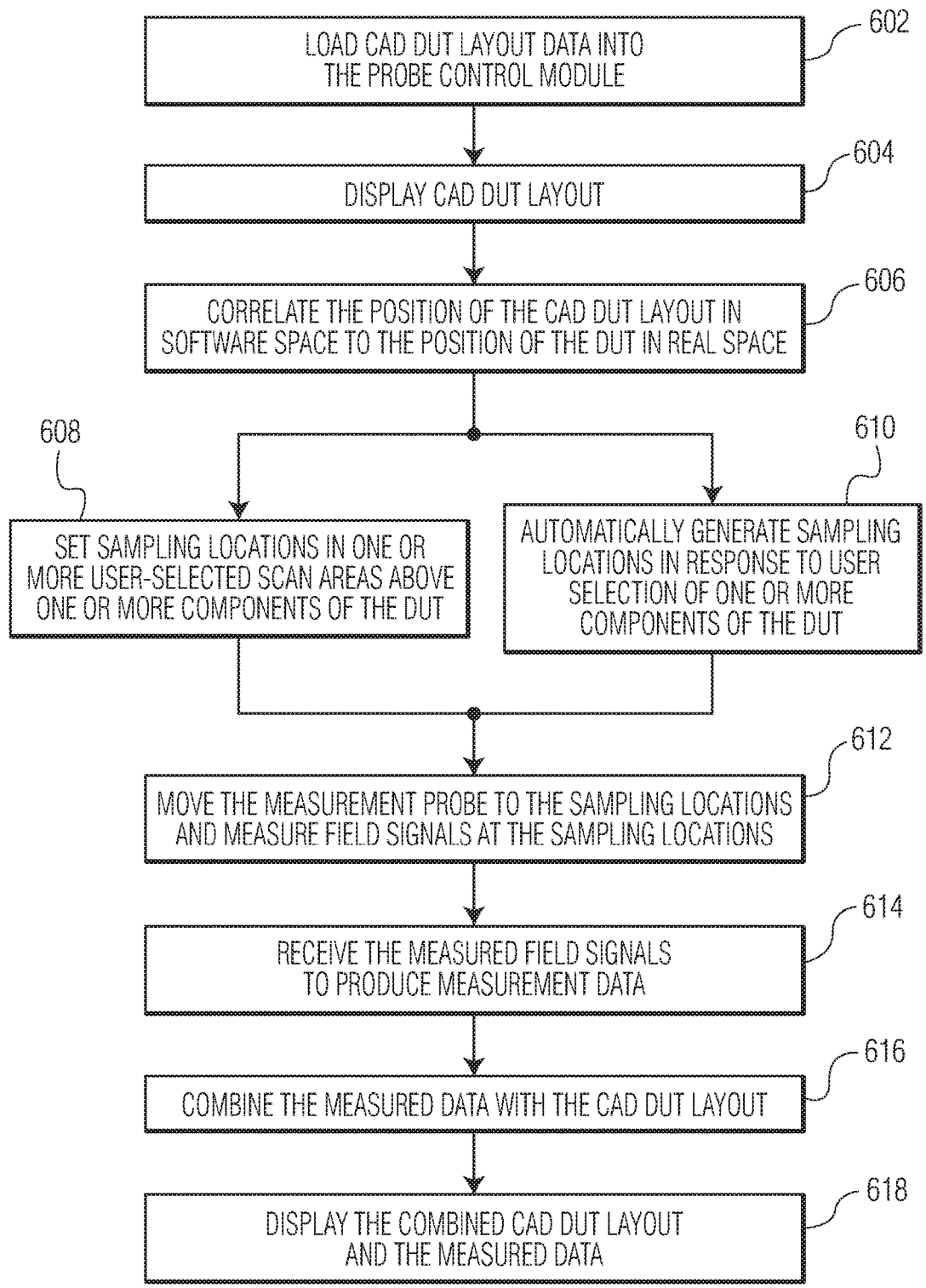
FIG. 6 is a process flow diagram of the testing operation of the system of FIG. 1 in accordance with an embodiment of the invention.

The testing operation of the testing system 100 in accordance with an embodiment of the invention is described with reference to a process flow diagram of FIG. 6. At block 602, CAD DUT layout data is loaded into the probe control module 308 of the processing system 110. At block 604, the CAD DUT layout is displayed on a computer monitor using the loaded data. At block 606, the position of the CAD DUT layout in software space is correlated with the position of the DUT on the scanning system 106 in real space.

Next, at block 608, sampling locations or testing points are set in one or more user-selected scan areas above one or more components of the DUT by the probe control module 138. The scan areas are selected by a user using the displayed CAD DUT layout. Alternatively, at block 610, sampling locations or testing points are automatically generated in response to user selection of one or more components of the DUT using the displayed CAD DUT layout by the probe control module.

Next, at block 612, the measurement probe 104 is moved to the sampling locations by the probe control module 138 and field signals are measured at the sampling locations by the electrical analyzing instrument 108. At block 614, the measured field signals are received by the measurement processing module 140 to produce measurement data.

Next, at block 616, the measured data is combined with the CAD DUT layout by the visualization module 142. At block 618, the combined CAD DUT layout and the measurement data is displayed on a computer monitor. The user can then visually examine the combined CAD DUT layout and the measurement data for analysis using the visual and non-visual information provided by the CAD DUT layout. The CAD DUT layout and the measurement data can also be united as one computational model for numerical simulation or for further analysis by EXPERT systems.

Figure 7:
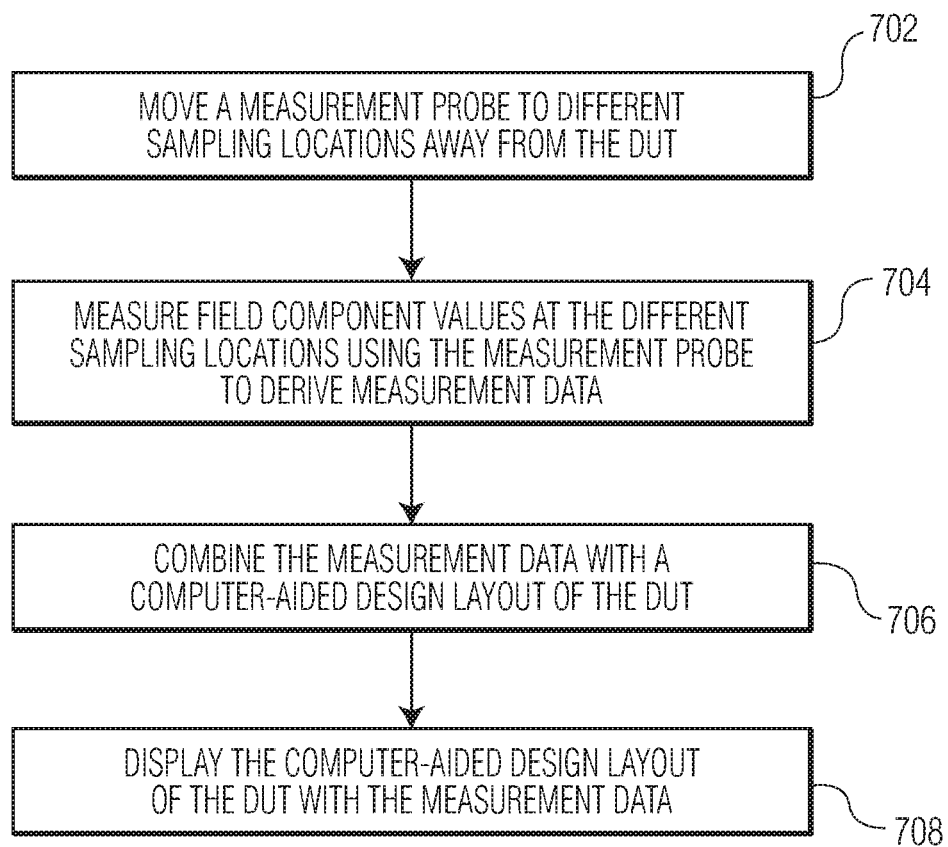
FIG. 7 is a flow diagram of a method for testing a device under test (DUT) in accordance with an embodiment of the invention.

A method for testing a device under test (DUT) in accordance with an embodiment of the invention is described with reference to a flow diagram of FIG. 7. At block 702, a measurement probe is moved to different sampling locations away from the DUT. At block 704, signals are measured at the different sampling locations using the measurement probe to derive measurement data. At block 706, the measurement data is combined with a computer-aided design layout of the DUT. At block 708, the computer-aided design layout of the DUT is displayed with the measurement data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for testing a device under test (DUT), the system comprising:
   a probe scanning system configured to move a measurement probe to different sampling locations away from the DUT, wherein the DUT includes electronic circuitry;

an electrical analyzing instrument connected to the measurement probe, the electrical analyzing instrument being configured to measure field component values at the different sampling locations using the measurement probe; and a processing system configured to:
control the probe scanning system to move the measurement probe to the different sampling locations away from the DUT;
receive the field component values to derive measurement data;
combine the measurement data with a computer-aided design layout of the DUT, the computer-aided design layout of the DUT including a visual representation of the DUT, wherein the computer-aided design layout of the DUT includes a three-dimensional representation of the DUT that allows different layers of the DUT to be shown; and
display the computer-aided design layout of the DUT with the measurement data for analysis.

2. The system of claim 1, wherein the processing system is further configured to correlate the position of the computer-aided design layout of the DUT in software space to the position of the DUT in real space.

3. The system of claim 1, wherein the processing system is further configured to define a scan area about the DUT in response to user input of the scan area using the computer-aided design layout of the DUT, the sampling locations being situated within the scan area.

4. The system of claim 1, wherein the processing system is further configured to automatically define the sampling locations in response to user selection of a component of the DUT using the computer-aided design layout of the DUT.

5. The system of claim 1, wherein the component of the DUT is a conductive trace of the DUT.

6. The system of claim 1, wherein the processing system is further configured to process the computer-aided design layout of the DUT and the measurement data to a single computational model.

7. The system of claim 1, wherein the processing system is further configured to perform a numerical simulation on the DUT using the single computational model.

8. The system of claim 1, further comprising an EXPERT system, wherein the single computational model is used as input to the EXPERT system for analysis.

9. The system of claim 1, wherein the DUT is a printed circuit board.

10. A method for testing a device under test (DUT), the method comprising:
moving a measurement probe to different sampling locations away from the DUT, wherein the DUT includes electronic circuitry;
measuring field component values at the different sampling locations using the measurement probe to derive measurement data;
combining the measurement data with a computer-aided design layout of the DUT, the computer-aided design layout of the DUT including a visual representation of the DUT, wherein the computer-aided design layout of the DUT includes a three-dimensional representation of the DUT that allows different layers of the DUT to be shown; and
displaying the computer-aided design layout of the DUT with the measurement data for analysis.

11. The method of claim 10, further comprising correlating the position of the computer-aided design layout of the DUT in software space to the position of the DUT in real space.

12. The method of claim 10, further comprising defining a scan area about the DUT in response to user input of the scan area using the computer-aided design layout of the DUT, the sampling locations being situated within the scan area.

13. The method of claim 10, further comprising automatically defining the sampling locations in response to user selection of a component of the DUT using the computer-aided design layout of the DUT.

14. The method of claim 10, wherein the component of the DUT is a conductive trace of the DUT.

15. The method of claim 10, further comprising processing the computer-aided design layout of the DUT and the measurement data to a single computational model.

16. The method of claim 15, further comprising performing a numerical simulation on the DUT using the single computational model.

17. The method of claim 15, further comprising inputting the single computational model to an EXPERT system for analysis.

18. The method of claim 10, wherein the DUT is a printed circuit board.

* * * * *